United States Patent
Xie et al.

(10) Patent No.: US 10,651,597 B2
(45) Date of Patent: May 12, 2020

(54) CARD EDGE CONNECTOR EQUIPPED WITH ROTATABLE EJECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Ce-En Xie, Kunshan (CN); Zhuang-Xing Li, Kunshan (CN); Wen-Jun Tang, Kunshan (CN); Xue-Wu Bu, Kunshan (CN)

(73) Assignees: FOXCONN (KUNSHAN) COMPUTER CONNECTOR CO. LTD, Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/502,013

(22) Filed: Jul. 2, 2019

(65) Prior Publication Data

US 2020/0014147 A1 Jan. 9, 2020

(30) Foreign Application Priority Data

Jul. 3, 2018 (CN) .......................... 2018 1 0720833

(51) Int. Cl.
*H01R 13/629* (2006.01)
*H01R 12/72* (2011.01)

(52) U.S. Cl.
CPC ....... *H01R 13/62983* (2013.01); *H01R 12/72* (2013.01); *H01R 13/62966* (2013.01)

(58) Field of Classification Search
CPC .. H01R 13/64; H01R 13/5025; H01R 13/629; H01R 13/62; H01R 12/7076; H01R 4/66
See application file for complete search history.

(56) References Cited

U.S. PATENT DOCUMENTS 5,478,259 A * 12/1995 Noschese ............. H01R 13/658
439/607.31
5,688,147 A * 11/1997 Coteus ............... H01R 12/7005
439/633

(Continued)

FOREIGN PATENT DOCUMENTS

CN 102157811 B 1/2013
CN 102882030 B 5/2015

*Primary Examiner* — Abdullah A Riyami
*Assistant Examiner* — Nader J Alhawamdeh
(74) *Attorney, Agent, or Firm* — Wei Te Chung; Ming Chieh Chang

(57) ABSTRACT

A card edge connector includes an insulative elongated housing, a plurality of contacts disposed in the housing, and a pair of rotatable ejectors at two ends of the housing. The housing includes a pair of side walls extending along the longitudinal direction with a receiving slot therebetween in a transverse direction perpendicular to the longitudinal direction, and a pair of towers at two opposite ends of the housing in the longitudinal direction. The receiving slot is configured to receive a card type memory module. The pair of ejectors are disposed in the corresponding towers, respectively. Each ejector includes a kicker at the bottom wherein a tip of the kicker will not invade into the space between the pair of outermost contacts so as not interfere with the corresponding outermost contacts when the ejector is rotated to be at an open/ejecting position.

14 Claims, 7 Drawing Sheets

(56) References Cited

U.S. PATENT DOCUMENTS

| | | | | |
|---|---|---|---|---|
| 5,842,880 A * | 12/1998 | Pei | H01R 12/7005 | 439/327 |
| 5,957,708 A * | 9/1999 | Lin | H01R 12/7005 | 439/157 |
| 6,093,046 A * | 7/2000 | Chiou | H01R 12/7005 | 439/378 |
| 6,322,388 B1 * | 11/2001 | Akio | H01R 13/5812 | 439/459 |
| 6,663,402 B1 * | 12/2003 | Yu | H01R 13/6582 | 439/108 |
| 6,672,887 B1 * | 1/2004 | Yu | H01R 13/6582 | 439/108 |
| 6,695,630 B1 * | 2/2004 | Ku | H05K 7/1431 | 439/152 |
| 6,821,149 B2 * | 11/2004 | Lai | H01R 23/6873 | 439/607.31 |
| 7,108,554 B2 * | 9/2006 | Huang | H01R 23/6873 | 439/378 |
| 7,207,815 B1 * | 4/2007 | Ju | H01R 12/7029 | 439/159 |
| 7,442,093 B2 * | 10/2008 | Li | H01R 12/721 | 439/633 |
| 7,491,092 B2 * | 2/2009 | Zhu | H01R 13/6456 | 439/633 |
| 7,771,232 B2 * | 8/2010 | Si | H01R 13/658 | 439/607.01 |
| 8,038,459 B2 * | 10/2011 | Hayauchi | H01R 13/5213 | 439/301 |
| 8,092,239 B2 * | 1/2012 | Nishiyama | H01R 12/7005 | 439/157 |
| 8,794,988 B2 * | 8/2014 | Tanaka | H01R 12/83 | 439/326 |
| 2005/0277334 A1 * | 12/2005 | Huang | H01R 23/6873 | 439/607.01 |
| 2007/0254526 A1 * | 11/2007 | Lai | H05K 1/18 | 439/637 |
| 2010/0323549 A1 * | 12/2010 | Hayauchi | H01R 13/5213 | 439/357 |
| 2012/0135618 A1 * | 5/2012 | Shen | H01R 12/721 | 439/152 |
| 2013/0084723 A1 * | 4/2013 | Shen | H01R 12/7029 | 439/159 |
| 2013/0095679 A1 * | 4/2013 | Li | H01R 12/7005 | 439/157 |
| 2015/0318627 A1 * | 11/2015 | Berry, Jr. | H01R 12/7076 | 714/6.32 |
| 2016/0020539 A1 * | 1/2016 | Li | H01R 12/707 | 439/155 |
| 2016/0020540 A1 * | 1/2016 | Shen | G06F 1/203 | 439/155 |

\* cited by examiner

CARD EDGE CONNECTOR EQUIPPED WITH ROTATABLE EJECTOR

BACKGROUND OF THE INVENTION

1. Field of the Invention

The invention relates to the electrical connector, particularly to the electrical connector equipped with a rotatable ejector at one end which does not interfere with the outermost contacts during operation.

2. Description of Related Art

China Patent No. CN102882030B discloses a card edge connector for receiving a card type memory module and equipped with the rotatable ejector the end to lock or eject the memory module with regard to the connector housing wherein the outermost contacts are different from others by upward elevation for not interfering with the tip of the kicker of the ejector during rotational ejection. Anyhow, the different configuration of the outermost contacts may be inferior for manufacturability.

It is desired to have the electrical connector equipped with a rotatable ejector at one end which will not interfere with the corresponding outermost contacts during rotational ejection.

SUMMARY OF THE INVENTION

A card edge connector includes an insulative elongated housing, a plurality of contacts disposed in the housing, and a pair of rotatable ejectors at two ends of the housing. The housing includes a pair of side walls extending along the longitudinal direction with a receiving slot therebetween in a transverse direction perpendicular to the longitudinal direction, and a pair of towers at two opposite ends of the housing in the longitudinal direction. The receiving slot is configured to receive a card type memory module. The pair of ejectors are disposed in the corresponding towers, respectively. Each ejector includes a kicker at the bottom wherein a tip of the kicker will not invade into the space between the pair of outermost contacts so as not interfere with the corresponding outermost contacts when the ejector is rotated to be at an open/ejecting position.

Compared with the conventional design, viewed in the transverse direction, the tip of the kicker of the ejector of the instant invention is located beside the outermost contacts when the ejector is moved to an open/ejecting position and the tip of the kicker is raised upward to the uppermost position. Differently, in the conventional design, the tip of the kicker of the ejector is essentially located between the pair of outermost contacts when the ejector is moved to an open/ejecting position and the tip of the kicker is raised upward to the uppermost position. This is the reason why the conventional design requires to have the outermost contacts differently shaped by elevation of the contacting sections for not interfering with the tip of the kicker of the ejector when the ejection is outwardly rotated and the tip of the kicker is upwardly raised to the uppermost position.

Other objects, advantages and novel features of the invention will become more apparent from the following detailed description when taken in conjunction with the accompanying drawings.

DETAILED DESCRIPTION OF THE PREFERRED EMBODIMENT

Figure 1:
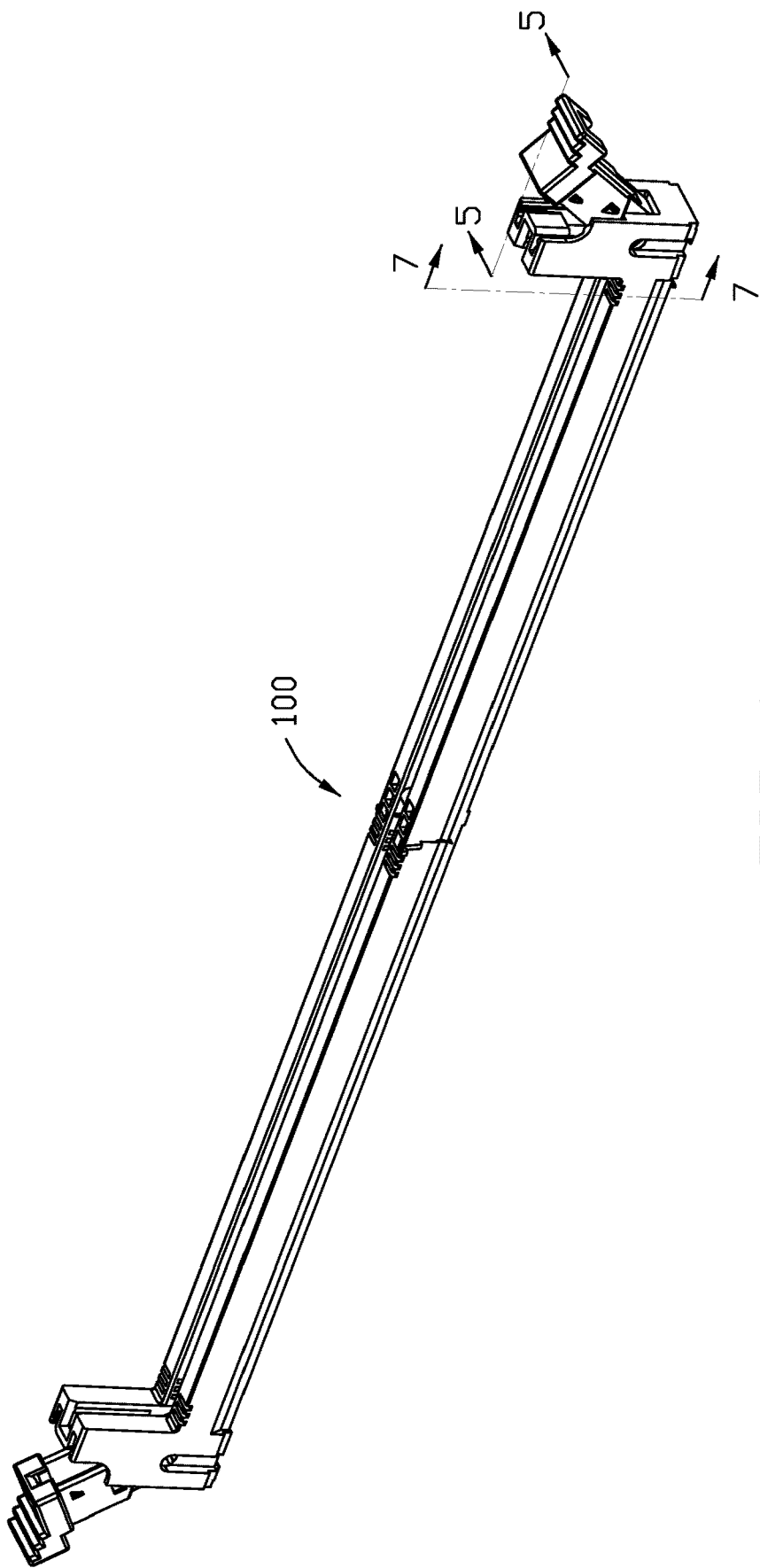
FIG. 1 is a perspective view of an electrical connector according to the invention.
Figure 2:
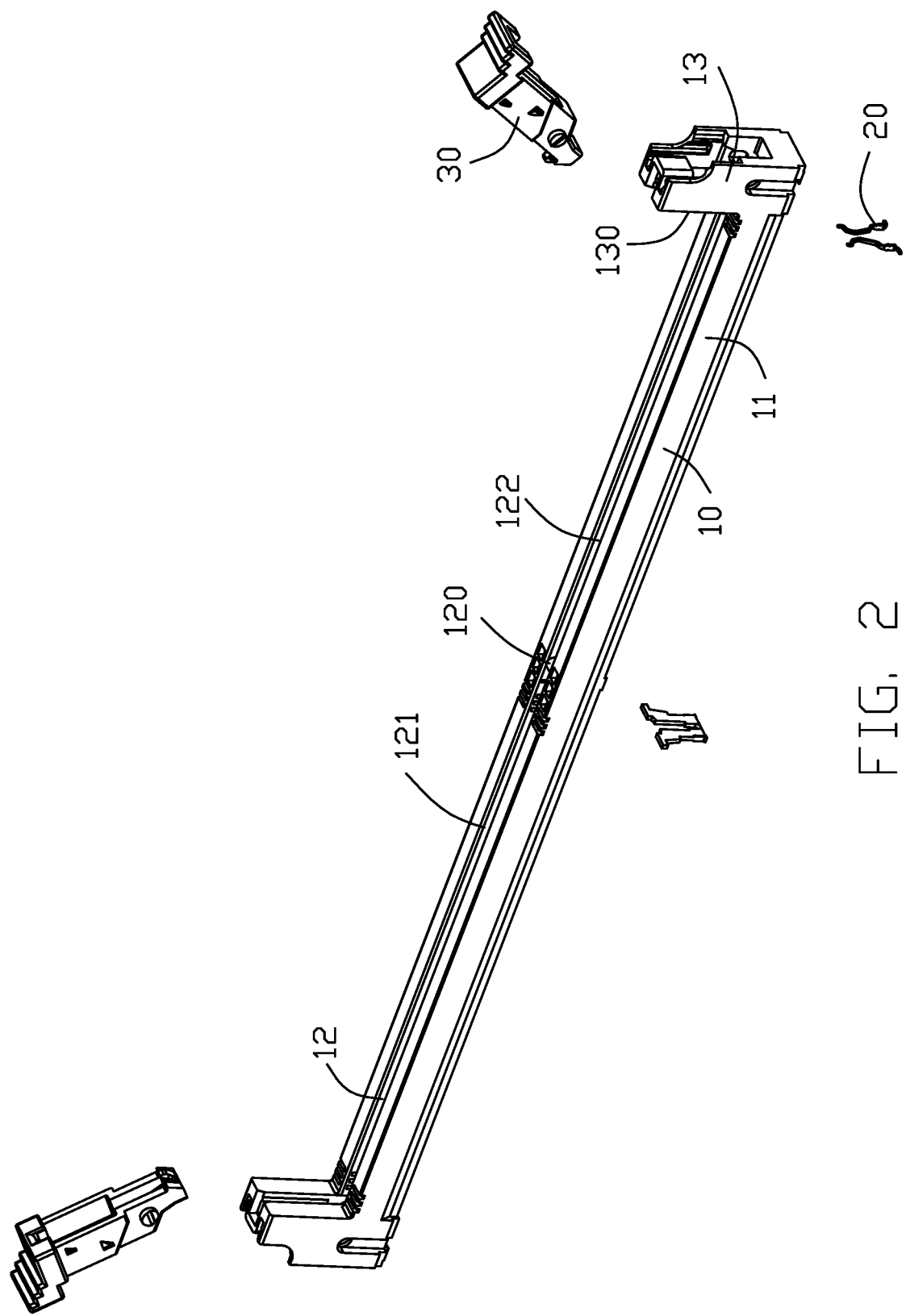
FIG. 2 is an exploded perspective view of the electrical connector of FIG. 1.
Figure 3:
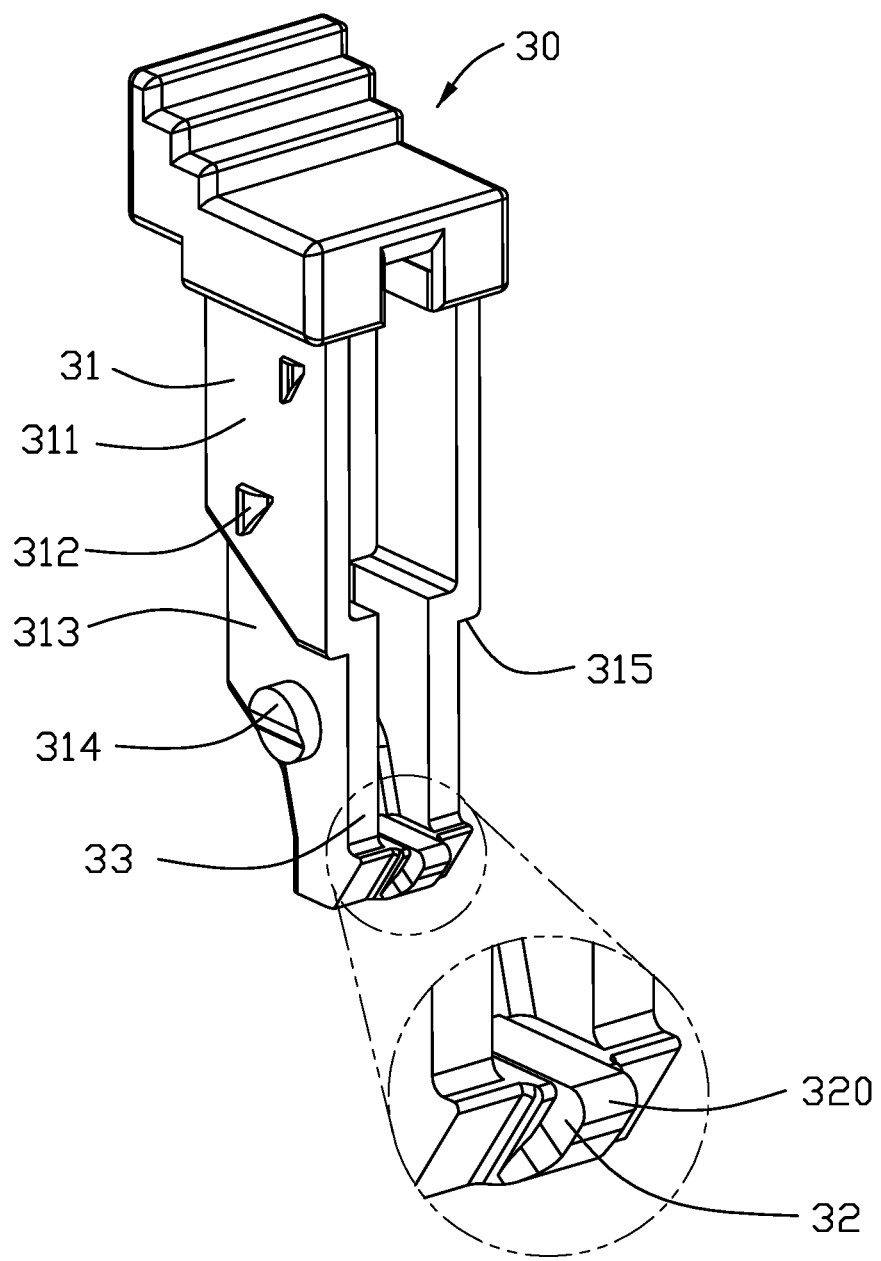
FIG. 3 is a perspective view of the ejector of the electrical connector of FIG. 1.

Referring to FIGS. 1-7, an card edge type electrical connector 100 includes an insulative elongated housing 10, a plurality of contacts 20 retained in the housing 10, and a pair of rotatable ejectors 30 disposed at two opposite ends of the housing 10. The housing 10 includes a pair of elongated side walls 11 extending along the longitudinal direction, and a receiving slot 12, for receiving the card type memory module (not shown), formed between the pair of side walls 11 in the transverse direction perpendicular to the longitudinal direction, and a pair of towers 13 located at two opposite ends of the housing 11 in the longitudinal direction. The housing 10 includes a key 120 in the receiving slot 12 to form a first part 121 and a second part 122 with a ratio therebetween as 72.85:65.10 for DDR5 DIMM and as 74.55:63.40 for DDR4 DIMM. The ejector 30 is disposed in the corresponding tower 13 and moveable between an open/ejecting/outer position and a closed/locking/inner position. The contacts 20 are positioned in the pair of side walls 11, and includes a pair of outermost contacts 21 adjacent to the corresponding pair of ejectors 30.

Figure 4:
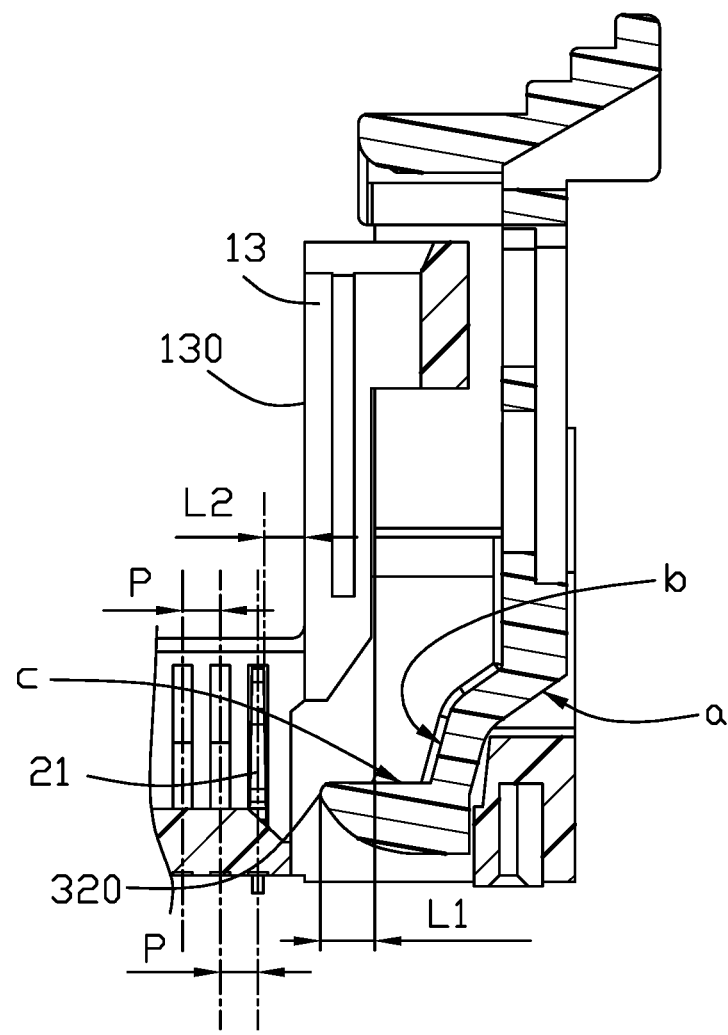
FIG. 4 is a cross-sectional view of the ejector of the electrical connector of FIG. 3 when the ejector is located in a closed/locking position.

The ejector 30 includes a main body 31 and a kicker 32 which is adapted to enter the receiving slot 12 when the ejector 30 is moved to the outer position. The kicker 32 forms an upward sitting face "c" (FIG. 4) on which the bottom edge of the memory module (not shown) is seated when the memory module (not shown) is received within the receiving slot 12 and locked by the ejector 30. The main body 31 includes an upper first section 311 and a lower second section 312 wherein the first section 311 is wider than the second section 312 so as to form a step 315 therebetween. The main body 31 of the ejector 30 forms a front edge 33 and the kicker 32 extends forwardly beyond the front edge 33. Notably, the tip 320 of the kicker 32 extends forwardly beyond the front edge 33 with a distance L1 which is 1/17 mm. The tower 13 forms another front edge 130 which is in front of the front edge 33 of the ejector 30 in the longitudinal direction. Another distance L2 between the outermost contact 21 and the front edge 130 of the tower 13 is 0.84 mm. Notably, as shown in FIG. 4, the pitch P of the contacts 20 is close or similar to the distance L2. When the ejector 30 is moved to the open/ejecting/outer position, the tip 320 of the kicker 32 is spaced, along the longitudinal direction, from the outermost contact 21 with a distance L3 which is 0.06 mm that is much smaller than either the pitch of the contacts 20 or the width of the contact 20. This spatial arrangement prevents the potential interference between the kicker 32 of the ejector 30 and the pair of outermost contacts 21. It is noted that the upper locking head (not labeled) of the ejector 30 is received within the corresponding side notch of the memory module (not shown) to lock the memory module (not shown) in the connector 100 when the ejector 30 is located at the closed/locking/inner position. Notably, the tip 320 of the kicker 32 does not extend forwardly beyond the front edge 130 of the corresponding tower 13 in the longitudinal direction when the ejector 30 is located in the closed/locking/inner position while extending forwardly beyond the front edge 130 of the corresponding tower 13 when the ejector is located in the open/ejecting/outer position in the longitudinal direction. The first section 311 forms the protrusion 312 to engage the tower 13. The second section 313 forms pivotal shaft 314 by which the ejector 30 is mounted to the tower 13 and about which the ejector 30 is rotated. Notably, as shown in FIG. 4, on the bottom portion the ejector forms an upwardly facing oblique guiding face "b" adjacent to the sitting face c for guiding the downward loading memory module (not shown) during locking the memory module (not shown). On the other hand, the ejector 30 further includes a downwardly facing oblique face "a" for complying with a platform (not labeled) of the housing 10 thereunder, when the ejector 30 is moved to the open/ejecting/outer position.

Figure 5:
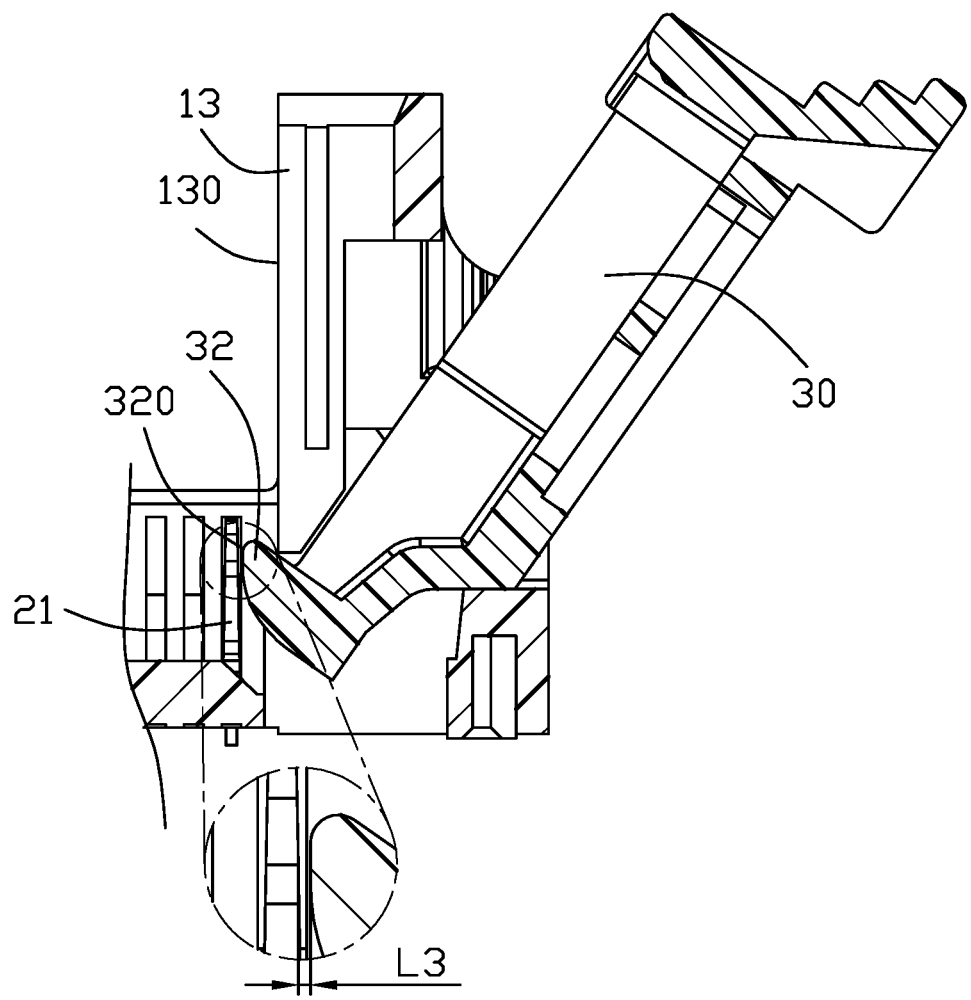
FIG. 5 is a cross-sectional view of the ejector of the electrical connector of FIG. 3 when the ejector is located in an open/ejecting position.
Figure 6:
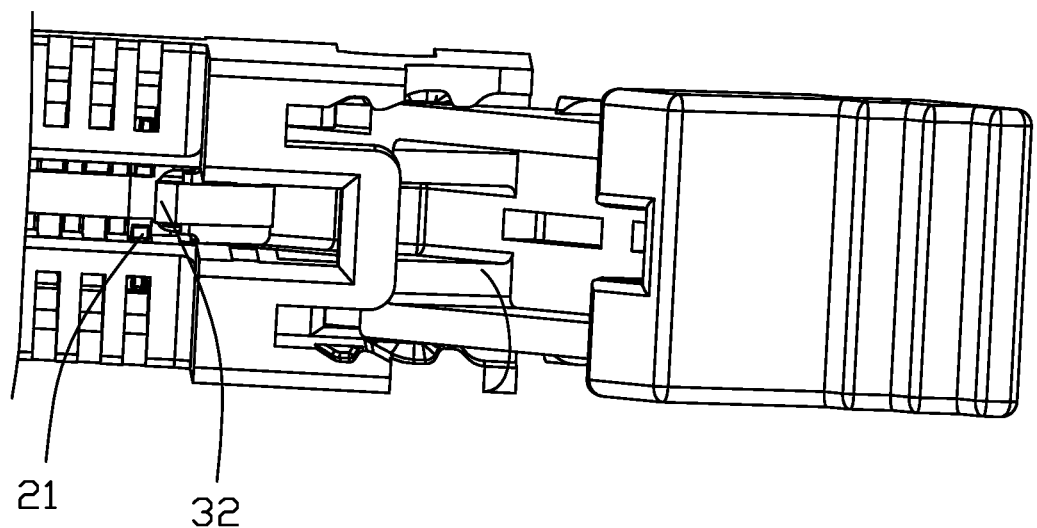
FIG. 6 is a downward view of a portion of the electrical connector of FIG. 1 to show the tip of the kicker of the ejector is spaced from the outermost contacts in the longitudinal direction with possibility of interference therebetween.
Figure 7:
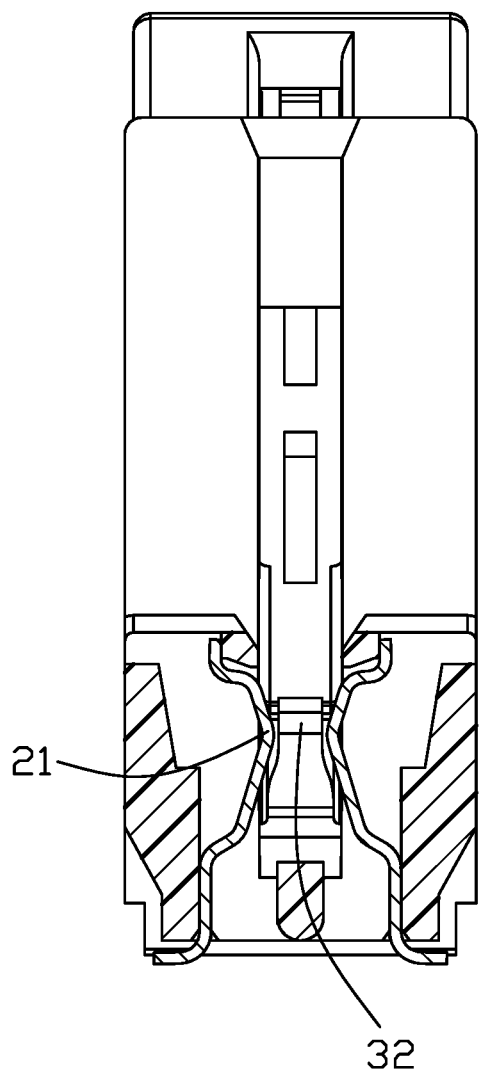
FIG. 7 is a cross-sectional view of the electrical connector of FIG. 1 to show the tip of the kicker of the ejector is higher than the contacting regions of the corresponding outermost contacts so as to assure the memory module will be completely removed away from the contacts without any retention force remaining between the contacts and the memory module.

Understandably, as shown in FIG. 7, the tip 320 of the kicker 32 should be higher than the contacting region, i.e., the contacting apex, (not labeled) of the outermost contacts 21 in the vertical direction so as to efficiently remove the memory module (not shown) out of the connector 100. As shown in FIG. 1, in operation, the memory module (not shown) is sandwiched in the tower 13 in the transverse direction and restrained between the pair of towers 13 in the longitudinal direction perpendicular to the transverse direction while is retained by the ejector in the vertical direction perpendicular to both the longitudinal direction and the transverse direction. On one hand, because the length of the housing 10 is regulated by the industry standard and can not be increased, it is relatively difficult to have the kicker not only long enough to raise up the memory module (not shown) to leave the contacting regions of the contacts but also short enough to not touch the outermost contacts 21 when the ejector 30 is moved to the open/ejecting/outer position. On the other hand, the pivotal shaft 314 is located closer to the kicker for reducing the rotation path of the tip 320 of the kicker 32 for not interfering with the outermost contacts 21. In this embodiment, the rotation angle is between thirty degrees and forty-five degrees so as not to have the tip 320 of the kicker 32 of the ejector 30 raised upward too high and improperly invade the space between the contacting regions of the outermost contacts. As shown in FIGS. 4 and 5, the bottom portion of the ejector 30 includes, in a same cross-section, a horizontal first segment with the upward sitting face "c", and an oblique second segment with the upwardly facing oblique guiding face "b", and an oblique third segment with the downward facing oblique face "a" so as to have not only the required strength but also the required configuration for either complying with the housing during the rotation/ejection of the ejector 30 or guiding the memory module (not shown) during loading.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. An electrical connector for receiving a memory module, comprising:
    an insulative elongated housing having a pair of elongated side walls extending along a longitudinal direction with a receiving slot formed therebetween in a transverse direction perpendicular to the longitudinal direction;
    a pair of towers formed at two opposite ends of the housing in the longitudinal direction;
    a plurality of contacts retained in the pair of side walls and having corresponding contacting regions exposed in the receiving slot;
    a pair of rotatable ejectors mounted in the corresponding towers and moveable between an open position and a closed position, respectively, each of said ejectors including a main body and a kicker at a bottom portion thereof; wherein
    when the ejector is moved to the open position, a tip of the kicker is not only higher, in a vertical direction perpendicular to both the longitudinal direction and the transverse direction, than the contacting regions of a pair of corresponding outermost contacts neighboring the ejector for efficiently ejecting the memory module, but also spaced, with a distance, from the outermost contacts in the longitudinal direction for no interference therebetween; wherein
    each tower restricts the memory module in both the transverse direction and the longitudinal direction while the ejector restricts the memory module in the vertical direction; wherein
    the tower forms a front edge, and the tip of the kicker of the corresponding ejector extends behind the front edge in the longitudinal direction when the ejector is moved to the closed position while extending beyond the front edge in the longitudinal direction when the ejector is moved to the open position; wherein
    another distance formed between the front edge and the outermost contact in the longitudinal direction, is essentially equal to 0.84 mm.

2. The electrical connector as claimed in claim 1, wherein the distance is much smaller than either a pitch of the contacts or a width of the contact.

3. The electrical connector as claimed in claim 2, wherein said distance is essentially equal to 0.06 mm.

4. The electrical connector as claimed in claim 1, wherein the main body of the ejector forms another front edge which is located behind the front edge of the corresponding tower in the longitudinal direction, and the tip of the kicker of the ejector extends beyond said another front edge.

5. The electrical connector as claimed in claim 4, wherein another distance between the tip of the kicker of the ejector and said another front edge of the ejector is essentially equal to 1.17 mm.

6. The electrical connector as claimed in claim 1, where the bottom portion of the ejector forms a horizontal first segment with an upward sitting face for supporting a bottom edge of the memory module, a second segment with an upward oblique guiding face for guiding the memory module during loading, and a third segment with a downward oblique face for complying with a platform of the housing when the ejector is moved to the open position.

7. The electrical connector as claimed in claim 6, wherein the ejector further includes a pair of pivotal shafts on two lateral sides, and the pivotal shafts are located closer to the third segment that to the first segment and the second segment.

8. An electrical connector comprising:
an insulative elongated housing having a pair of elongated side walls extending along a longitudinal direction with a receiving slot formed therebetween in a transverse direction perpendicular to the longitudinal direction;
at least one tower formed at one of two opposite ends of the housing in the longitudinal direction;
a plurality of contacts retained in at least one of said pair of side walls and having corresponding contacting regions exposed in the receiving slot;
at least one rotatable ejector mounted in the tower and moveable between an open position and a closed position, said ejector including a main body and a kicker at a bottom portion thereof; wherein
when the ejector is moved to the open position, a tip of the kicker is not only higher, in a vertical direction perpendicular to both the longitudinal direction and the transverse direction, than the contacting region of an outermost contact neighboring the ejector for efficiently ejecting the memory module, but also spaced, with a distance, from the outermost contact in the longitudinal direction for no interference therebetween; wherein
said tower restricts the memory module in both the transverse direction and the longitudinal direction while the ejector restricts the memory module in the vertical direction; wherein
the tower forms a front edge, and the tip of the kicker of the corresponding ejector extends behind the front edge in the longitudinal direction when the ejector is moved to the closed position while extending beyond the front edge in the longitudinal direction when the ejector is moved to the open position; wherein
another distance formed between the front edge and the outermost contact in the longitudinal direction, is essentially equal to a pitch of said contacts.

9. The electrical connector as claimed in claim 8, wherein the distance is much smaller than either a pitch of the contacts or a width of the contact.

10. The electrical connector as claimed in claim 9, wherein said distance is essentially equal to 0.06 mm.

11. The electrical connector as claimed in claim 8, wherein the main body of the ejector forms another front edge which is located behind the front edge of the corresponding tower in the longitudinal direction, and the tip of the kicker of the ejector extends beyond said another front edge.

12. The electrical connector as claimed in claim 11, wherein another distance between the tip of the kicker of the ejector and said another front edge of the ejector is essentially equal to 1.17 mm.

13. The electrical connector as claimed in claim 8, where the bottom portion of the ejector forms a horizontal first segment with an upward sitting face for supporting a bottom edge of the memory module, a second segment with an upward oblique guiding face for guiding the memory module during loading, and a third segment with a downward oblique face for complying with a platform of the housing when the ejector is moved to the open position.

14. The electrical connector as claimed in claim 13, wherein the ejector further includes a pair of pivotal shafts on two lateral sides, and the pivotal shafts are located closer to the third segment than to the first segment and the second segment.

* * * * *